United States Patent
Nam et al.

(10) Patent No.: US 11,539,902 B2
(45) Date of Patent: Dec. 27, 2022

(54) CORRELATED DOUBLE SAMPLING CIRCUIT AND IMAGE SENSOR INCLUDING THE SAME

(71) Applicant: SAMSUNG ELECTRONICS CO., LTD., Suwon-si (KR)

(72) Inventors: Sangpil Nam, Pohang-si (KR); Kyunghoon Lee, Suwon-si (KR); Jungho Lee, Anyang-si (KR); Youngjae Cho, Hwaseong-si (KR); Michael Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 159 days.

(21) Appl. No.: 17/060,345

(22) Filed: Oct. 1, 2020

(65) Prior Publication Data
US 2021/0281783 A1    Sep. 9, 2021

(30) Foreign Application Priority Data
Mar. 6, 2020  (KR) .................. 10-2020-0028652

(51) Int. Cl.
*H04N 5/357*  (2011.01)
*H04N 5/3745*  (2011.01)
*H04N 5/235*  (2006.01)
*H04N 5/378*  (2011.01)

(52) U.S. Cl.
CPC ......... *H04N 5/3575* (2013.01); *H04N 5/2357* (2013.01); *H04N 5/378* (2013.01); *H04N 5/37455* (2013.01)

(58) Field of Classification Search
CPC ............... H04N 5/2357; H04N 5/3575; H04N 5/37455; H04N 5/378
See application file for complete search history.

(56) References Cited

U.S. PATENT DOCUMENTS

| | | | |
|---|---|---|---|
| 6,801,254 B1 | 10/2004 | Nishio | |
| 7,671,908 B2 | 3/2010 | Lee | |
| 8,063,961 B2 | 11/2011 | Cho et al. | |
| 8,634,068 B2 | 1/2014 | Ackland et al. | |
| 9,942,496 B2 | 4/2018 | Ha et al. | |
| 2004/0080630 A1* | 4/2004 | Kim ..................... | H04N 5/2357 348/226.1 |
| 2005/0238259 A1* | 10/2005 | Kim ..................... | H04N 5/2357 348/E5.037 |
| 2018/0198996 A1 | 7/2018 | Ha et al. | |

FOREIGN PATENT DOCUMENTS

| | | |
|---|---|---|
| JP | 2002-051264 | 2/2002 |
| JP | 2006-303604 | 11/2006 |

* cited by examiner

*Primary Examiner* — Daniel M Pasiewicz
(74) *Attorney, Agent, or Firm* — F. Chau & Associates, LLC (57) ABSTRACT

A flicker detection circuit is provided. The flicker detection circuit may include a flicker detection correlated double sampling (FD CDS) circuit including first to sixth switches turned on or off based on a control signal, and first to fourth capacitors, the FD CDS circuit being configured to receive a flicker pixel signal output from at least one pixel, summate with an output offset signal, and amplify the summation based on a gain to form a flicker detection signal; and an analog-to-digital converter (ADC) configured to quantize the flicker detection signal.

20 Claims, 10 Drawing Sheets

CORRELATED DOUBLE SAMPLING CIRCUIT AND IMAGE SENSOR INCLUDING THE SAME

CROSS-REFERENCE TO RELATED APPLICATION

This application claims the benefit of priority under 35 U.S.C. § 119 to Korean Patent Application No. 10-2020-0028652, filed on Mar. 6, 2020, in the Korean Intellectual Property Office, the disclosure of which is incorporated by reference herein in its entirety.

FIELD

The inventive concept relates to correlated double sampling (CDS) circuits, and more particularly, to a CDS circuit for adjusting a gain and an output offset and an image sensor including the CDS circuit.

DISCUSSION OF RELATED ART

Image sensors may convert an optical signal, including image information about a subject, into an electrical signal. The image sensors may include charge coupled device (CCD) image sensors or complementary metal oxide semiconductor (CMOS) image sensors. Recently, as the computer industry and the communications industry advance, the demand for image sensors having enhanced performance is increasing in various electronic devices such as digital cameras, camcorders, personal communication systems (PCSs), game machines, security cameras, medical micro-cameras, and portable telephones.

Correlated double sampling (CDS) circuits are elements that may be applied to the field of CMOS image sensors, and may subtract an analog value, which is input when there is light or when there is no light, thereby removing a common noise component. CDS circuits may be used to increase detection sensitivity in low illumination environments.

SUMMARY

Exemplary embodiment image sensors may convert an optical signal, including image information about a subject, into an electrical signal. Such image sensors may include charge coupled device (CCD) image sensors and/or complementary metal oxide semiconductor (CMOS) image sensors, for example, and may be used. in various electronic devices such as digital cameras, camcorders, personal communication systems (PCSs), game machines, security cameras, medical micro-cameras, and portable telephones.

Exemplary embodiment correlated double sampling (CDS) circuits may be applied as elements of CMOS image sensors, and may subtract an analog value, which is input when there is light or there is no light, thereby removing a common noise component, such as to increase detection sensitivity in a low illumination environment.

According to an exemplary embodiment of the inventive concept, there is provided a flicker detection (FD) circuit including a flicker detection correlated double sampling (FD CDS) circuit having first to sixth switches turned on or off based on a control signal, and first to fourth capacitors, the FD CDS circuit being configured to receive a flicker pixel signal output from at least one pixel, summate with an output offset signal, and amplify the summation based on a gain to form a flicker detection signal; and an analog-to-digital converter (ADC) configured to quantize the flicker detection signal.

According to an exemplary embodiment of the inventive concept, there is provided an image sensor including a pixel array having a plurality of pixels configured to convert an optical signal into an electrical signal, a correlated double sampling (CDS) circuit configured to perform CDS on an image pixel signal and a reset signal output from each of pixels disposed in a first region of the pixel array, and a flicker detection circuit configured to perform flicker detection based on a flicker pixel signal and a reset signal output from each of pixels disposed in a second region of the pixel array.

According to an exemplary embodiment, an image sensor includes: a pixel array having a first plurality of pixels with a first plurality of outputs for a first plurality of electrical image signals, and a second plurality of pixels with at least one second output for at least one electrical flicker signal; a first correlated double sampling (CDS) circuit connected to the first plurality of outputs; a first analog-to-digital converter (ADC) connected to the first CDS circuit; and a flicker detection circuit connected to the at least one second output and having a second CDS circuit and a second ADC connected to the second CDS circuit. The image sensor may include a CDS circuit that is responsive to a first plurality of reset signals output from the first plurality of pixels. The image sensor may include a flicker detection circuit that is responsive to at least one reset signal output from the second plurality of pixels.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION

Hereinafter, exemplary embodiments may be described in detail with reference to the accompanying drawings.

Figure 1:
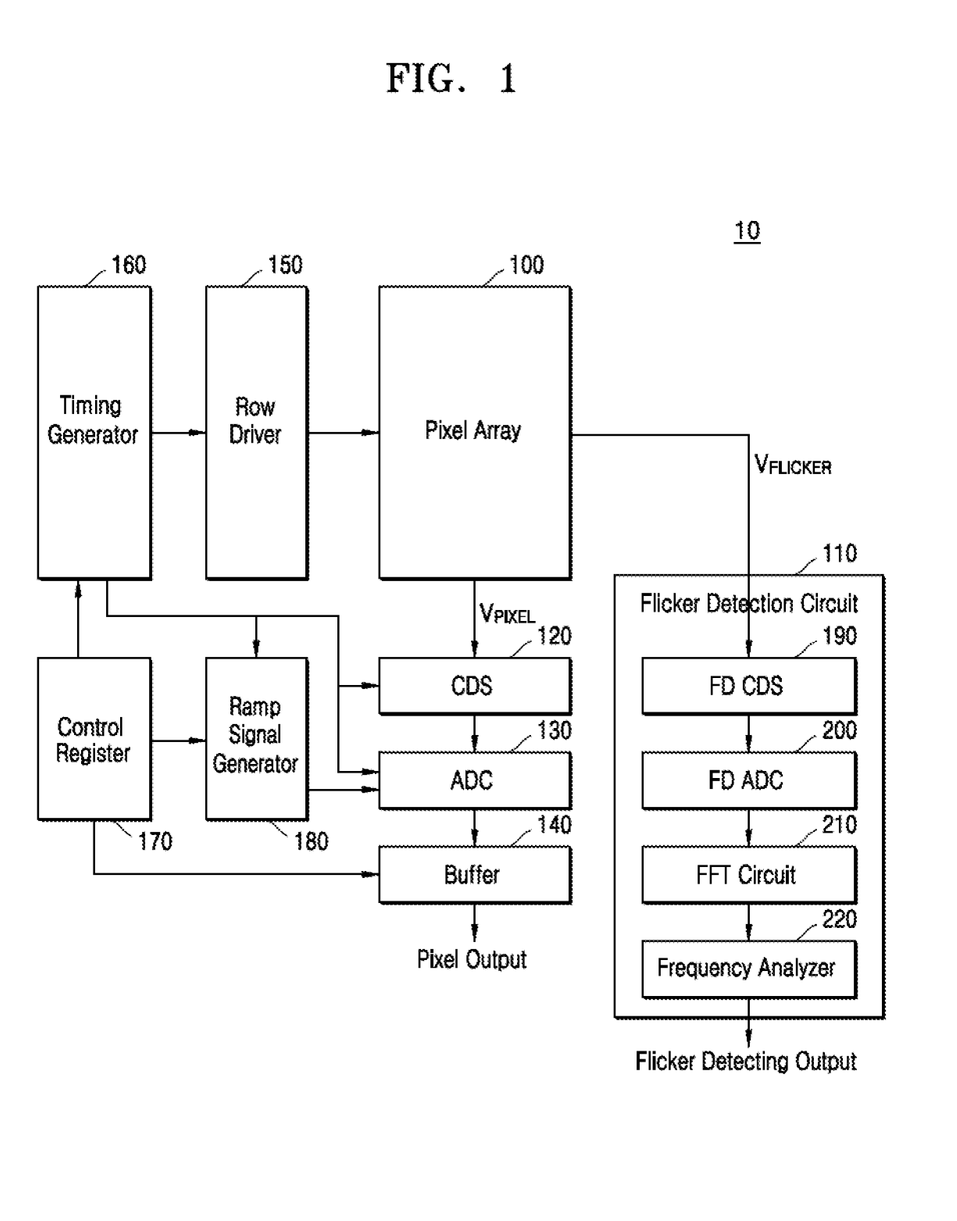
FIG. 1 is a block diagram of an image sensor according to an embodiment.

FIG. 1 illustrates an image sensor 10 according to an embodiment.

Referring to FIG. 1, the image sensor 10 may include a pixel array 100, a flicker detection (FD) circuit 110, a correlated double sampling (CDS) circuit 120, an analog-to-digital converter (ADC) 130, a buffer 140, a row driver 150, a timing generator 160, a control register 170, and a ramp signal generator 180. The flicker detection (FD) circuit 110 may include a flicker detection correlated double sampling (FD CDS) circuit 190, a flicker detection analog-to-digital converter (FD ADC) 200, a fast Fourier transform (FFT) circuit 210, and a frequency analyzer 220.

The pixel array 100 may include a plurality of pixels which are connected to a plurality of row lines and a plurality of column lines and are arranged in a matrix form. Each of the plurality of pixels may include a plurality of transistors and a photoelectric conversion element. The photoelectric conversion element may sense light to generate an image signal. For example, the photoelectric conversion element may generate electrons from light received thereby and may generate an electrical signal based on the number of generated electrons. According to an exemplary embodiment, the photoelectric conversion element may include at least one of a photodiode, a photogate, and a pinned photodiode.

The timing generator 160 may generate one or more control signals for controlling an operation of each of the row driver 150, the CDS circuit 120, the ADC 130, and the ramp signal generator 180.

The control register 170 may generate one or more control signals for controlling an operation of each of the ramp signal generator 180, the timing generator 160, and the buffer 140.

The row driver 150 may drive the pixel array 100 by row line units. For example, the row driver 150 may generate a selection signal for selecting one row line from among a plurality of row lines. Each of the plurality of pixels may sense incident light to output an image reset signal and an image signal to the CDS circuit 120 through a column line. The CDS circuit 120 may perform correlated double sampling on each of the image reset signal and the image signal as each is received.

The ADC 130 may compare a ramp signal, output from the ramp signal generator 180, with a sampling signal, output from the CDS circuit 120, to output a comparison signal. The ADC 130 may count a level transition time of the comparison signal based on a clock signal provided from the timing generator 160 to output a count value to the buffer 140. The ramp signal generator 180 may operate based on control by the timing generator 160.

The buffer 140 may store each of a plurality of digital signals output from the ADC 130 and may sense, amplify, and output each of the stored digital signals. Therefore, the buffer 140 may include a memory and a sensing amplifier, for example. The memory may store the count value, and the count value may denote a count value associated with a signal output from each of the plurality of pixels. The sensing amplifier may sense and amplify each count value output from the memory.

The FD CDS circuit 190 may receive a flicker pixel signal $V_{FLICKER}$ from the pixel array 100, perform a subtraction operation on a stored reset signal from the received flicker pixel signal $V_{FLICKER}$ to generate a signal, amplify the generated signal by a gain, and add an output offset to the amplified signal to output an analog signal. The flicker pixel signal $V_{FLICKER}$ may denote a signal received from each of pixels other than an active pixel array in the pixel array 100.

The gain may denote a value representing a level by which the flicker pixel signal $V_{FLICKER}$ is amplified and may vary by adjusting a capacitance of at least one capacitor included in the FD CDS circuit 190. The output offset may be a value for allowing a range of the amplified flicker pixel signal to match an input range of the FD ADC 200. The gain and the output offset may be described below in greater detail.

The FD ADC 200 may convert an analog signal, output from the FD CDS circuit 190, into a digital signal. Conversion of the analog signal into the digital signal may be substantially the same as an operation of the ADC 130, and thus, repetitive description may be omitted. The FD ADC 200 may transfer the digital signal to the FFT circuit 210.

The FFT circuit 210 may perform an FFT on an output signal of the FD ADC 200. The FFT circuit 210 may convert an output time domain signal of the FD ADC 200 into a frequency domain signal to obtain the intensity of light versus frequency. The frequency analyzer 220 may determine whether or not of a flicker is detected based on an FFT result of the FFT circuit 210. The flicker may be generated based on the periodic fluctuation of the intensity of light generated by fluorescent light, for example. For example, the frequency analyzer 220 may compare an FFT conversion value of the fluorescent light with a threshold value to determine whether or not a flicker is detected. An operation of detecting flicker may be described below in greater detail with reference to FIGS. 6 and 7.

Figure 2:
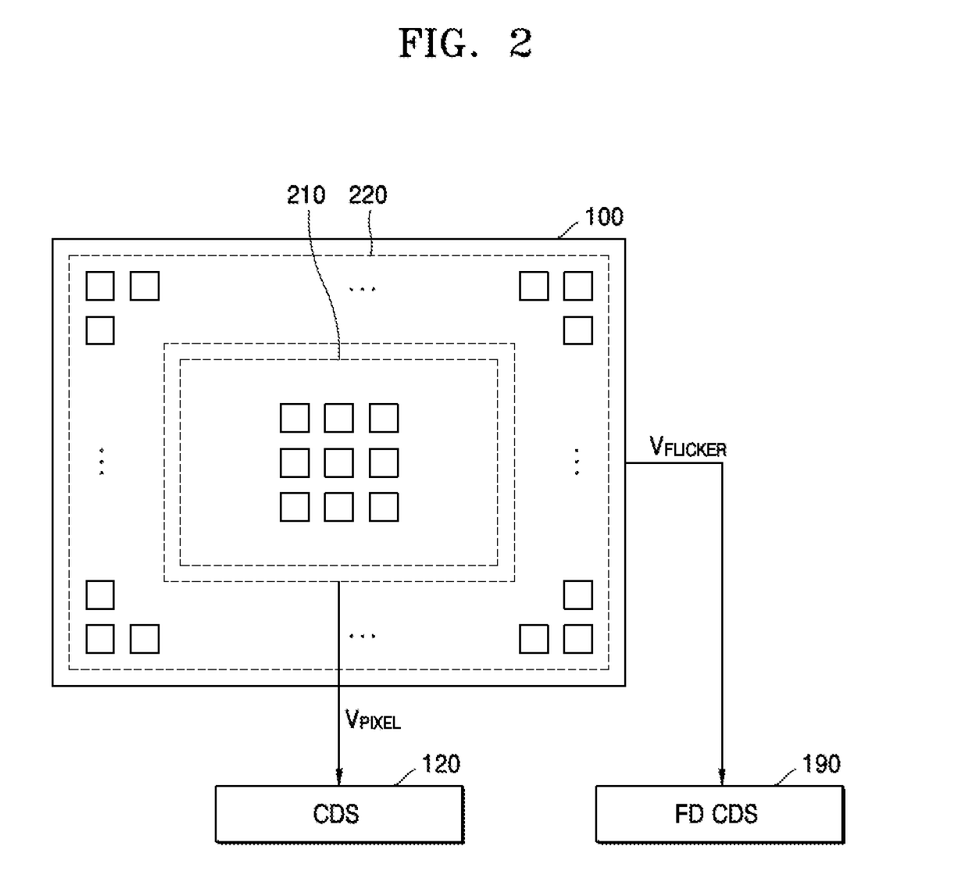
FIG. 2 is a block diagram of a pixel array according to an embodiment.

FIG. 2 illustrates a pixel array 100 according to an embodiment.

Referring to FIG. 2, the pixel array 100 may be divided into a first region 210 and a second region 220. The first region 210 may be referred to as an active pixel array. The first region 210 may include a plurality of pixels which output information about an image based on received light. That is, a signal $V_{PIXEL}$ generated by the pixels included in the first region 210 may be output to the CDS circuit 120 of FIG. 1 along a column line, for example.

The second region 220 may denote regions other than the first region 210 in the pixel array 100. That is, the second region 220 may include a plurality of pixels disposed at an outer portion of the pixel array 100. The second region 220 may be referred to as a flicker pixel array. The pixels of the second region 220 may output a flicker pixel signal $V_{FLICKER}$ to the FD CDS circuit 190.

Referring to FIG. 2, the flicker pixel signal $V_{FLICKER}$ may be a total sum of signals of the pixels included in the second region 220, without limitation. That is, an active pixel array of the first region 210 may output a pixel signal $V_{PIXEL}$ or the like at every column line, respectively, and a flicker pixel array of the second region 220 may output one flicker pixel signal $V_{FLICKER}$, obtained by merging pixel signals of flicker pixels included in the second region 220, to the FD CDS circuit 190.

In the above-described embodiment, the flicker pixel signal $V_{FLICKER}$ has been described as a total sum of the signals of the pixels included in the second region 220, but is not limited thereto. According to an alternate embodiment, the flicker pixel signal $V_{FLICKER}$ may be output by units of a plurality of column lines. In an alternate embodiment, the flicker pixel signal $V_{FLICKER}$ may be a maximum or a minimum of the signals of the pixels included in a plurality of column lines and/or in the second region 220.

Figure 3A:
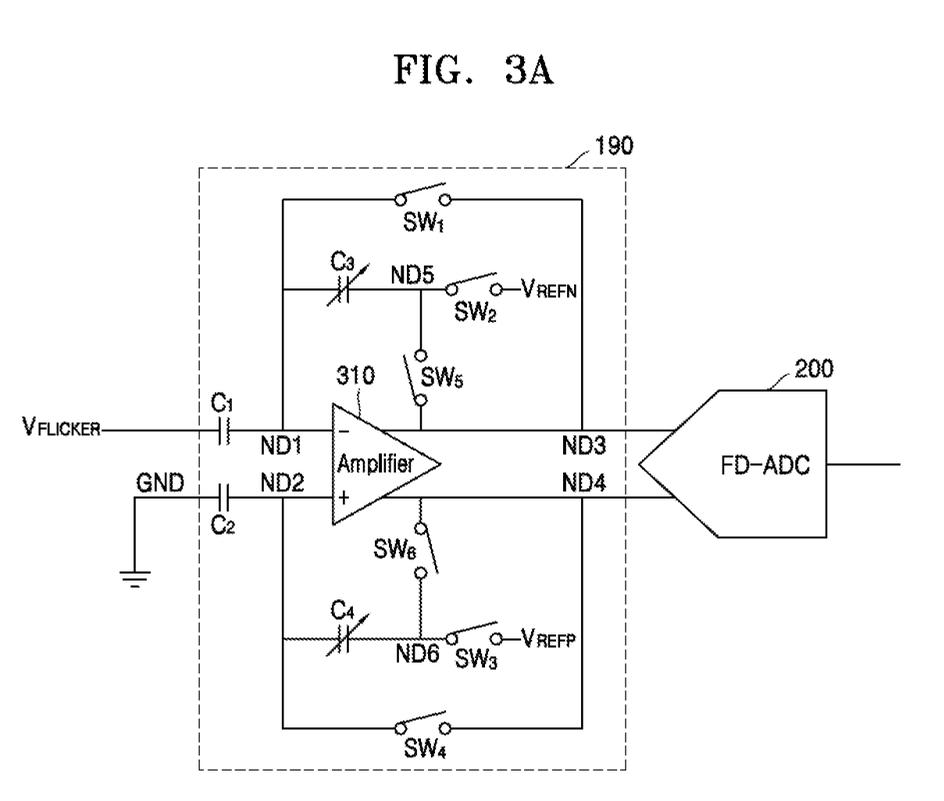
FIG. 3A is a circuit diagram illustrating a flicker detection (FD) correlated double sampling (CDS) (FD CDS) circuit and an FD analog-to-digital converter (FD ADC) according to an embodiment.

FIG. 3A illustrates an FD CDS circuit 190 and an FD ADC 200 according to an embodiment.

Referring to FIG. 3A, the FD CDS circuit 190 may include a plurality of capacitors, such as, for example, first to fourth capacitors $C_1$ to $C_4$, a plurality of switches, such as, for example, first to sixth switches $SW_1$ to $SW_6$, and an amplifier 310.

The first capacitor $C_1$ and the second capacitor $C_2$ among the plurality of capacitors may be respectively connected to input nodes of the amplifier 310. That is, the first capacitor $C_1$ may be disposed between a node, receiving a signal output from the flicker pixel array of the second region 220 of the pixel array 100, and one input node $ND_1$, such as, for example, a negative (−) input node of the amplifier 310. The second capacitor $C_2$ may be disposed between a ground node GND and the other input node $ND_2$, such as, for example, a positive (+) input node of the amplifier 310.

According to an exemplary embodiment, the first switch $SW_1$, and the fourth switch $SW_4$ may each be disposed between an input node and an output node of the amplifier 310, respectively. For example, the first switch $SW_1$, may be disposed between the negative input node $ND_1$, of the amplifier 310 and a positive output node $ND_3$ of the amplifier 310. When the first switch $SW_1$, is activated, a flicker pixel signal $V_{FLICKER}$ may be stored in the first capacitor $C_1$. As another example, the fourth switch $SW_4$ may be disposed between the positive input node $ND_2$ of the amplifier 310 and a negative output node $ND_4$ of the amplifier 310. When the fourth switch $SW_4$ is activated, a ground value may be stored in the second capacitor $C_2$. According to an exemplary embodiment, the ground node GND may be replaced with a voltage node having a certain voltage level.

The second switch $SW_2$, the third switch $SW_3$, the third capacitor $C_3$, and the fourth capacitor $C_4$ may adjust an output offset. That is, the second switch $SW_2$ and the third switch $SW_3$ may be connected to fifth and sixth nodes (for example, voltage nodes) $ND_5$ and $ND_6$ and may charge a certain reference voltage into the third capacitor $C_3$ and the fourth capacitor $C_4$, respectively. For example, the second switch $SW_2$ may be disposed between the fifth node $ND_5$ and a negative reference voltage node $V_{REFN}$. When the second switch $SW_2$ is activated, the negative reference voltage node $V_{REFN}$ may be electrically connected to the third capacitor $C_3$, and an electric charge may be charged into the third capacitor $C_3$ based on a level of a negative reference voltage node $V_{REFN}$. As another example, the third switch $SW_3$ may be disposed between the sixth node $ND_6$ and a positive reference voltage node $V_{REFP}$. When the third switch $SW_3$ is activated, the positive reference voltage node $V_{REFP}$ may be electrically connected to the fourth capacitor $C_4$, and an electric charge may be charged into the fourth capacitor $C_4$ based on a level of the positive reference voltage node $V_{REFP}$. A difference value between the positive reference voltage node $V_{REFP}$ and the negative reference voltage node $V_{REFN}$ may correspond to an output offset value.

The fifth switch $SW_5$ and the sixth switch $SW_6$ may electrically connect the output nodes $ND_3$ and $ND_4$ of the amplifier 310 to the fifth and sixth nodes $ND_5$ and $ND_6$, respectively. For example, the fifth switch $SW_5$ may be disposed between the positive output node $ND_3$ of the amplifier 310 and the fifth node $ND_5$. When the fifth switch $SW_5$ is activated, the positive output node $ND_3$ of the amplifier 310 may be electrically connected to the fifth node $ND_5$ and the third capacitor $C_3$ may be connected between the fifth node $ND_5$ and the negative input node $ND_1$, of the amplifier 310, and thus, the flicker pixel signal may be transferred to the positive output node $ND_3$ of the amplifier 310 through the first capacitor $C_1$ and the third capacitor $C_3$. In this case, the input flicker pixel signal may be amplified based on a capacitance ratio of the first capacitor $C_1$ and the third capacitor $C_3$. According to an exemplary embodiment, the third capacitor $C_3$ may be implemented as a variable capacitor, for variably adjusting an amplification gain of the third capacitor $C_3$. According to an exemplary embodiment, it is illustrated that capacitance values of the third capacitor $C_3$ and the fourth capacitor $C_4$ vary, but the inventive concept is not limited thereto. For example, capacitance values of the first capacitor $C_1$ and the second capacitor $C_2$ may be adjusted, or capacitance values of the first to fourth capacitors $C_1$ to $C_4$ may be independently adjusted.

As another example, the sixth switch $SW_6$ may be disposed between the negative output node $ND_4$ of the amplifier 310 and the sixth node $ND_6$. When the sixth switch $SW_6$ is activated, the negative output node $ND_4$ of the amplifier 310 may be electrically connected to the sixth node $ND_6$ and the fourth capacitor $C_4$ may be connected between the sixth node $ND_6$ and the positive input node $ND_2$ of the amplifier 310, and thus, the ground value may be transferred to the negative output node $ND_4$ of the amplifier 310 through the second capacitor $C_2$ and the fourth capacitor $C_4$. In this case, the ground value may be amplified based on a capacitance ratio of the second capacitor $C_2$ and the fourth capacitor $C_4$. According to an exemplary embodiment, an arbitrary voltage node instead of the ground node GND may be connected thereto, and in this case, an arbitrary voltage node value may be amplified based on a capacitance ratio of the second capacitor $C_2$ and the fourth capacitor $C_4$. Like the third capacitor $C_3$, the fourth capacitor $C_4$ may be implemented as a variable capacitor, for variably adjusting an amplification gain.

Figure 4A:
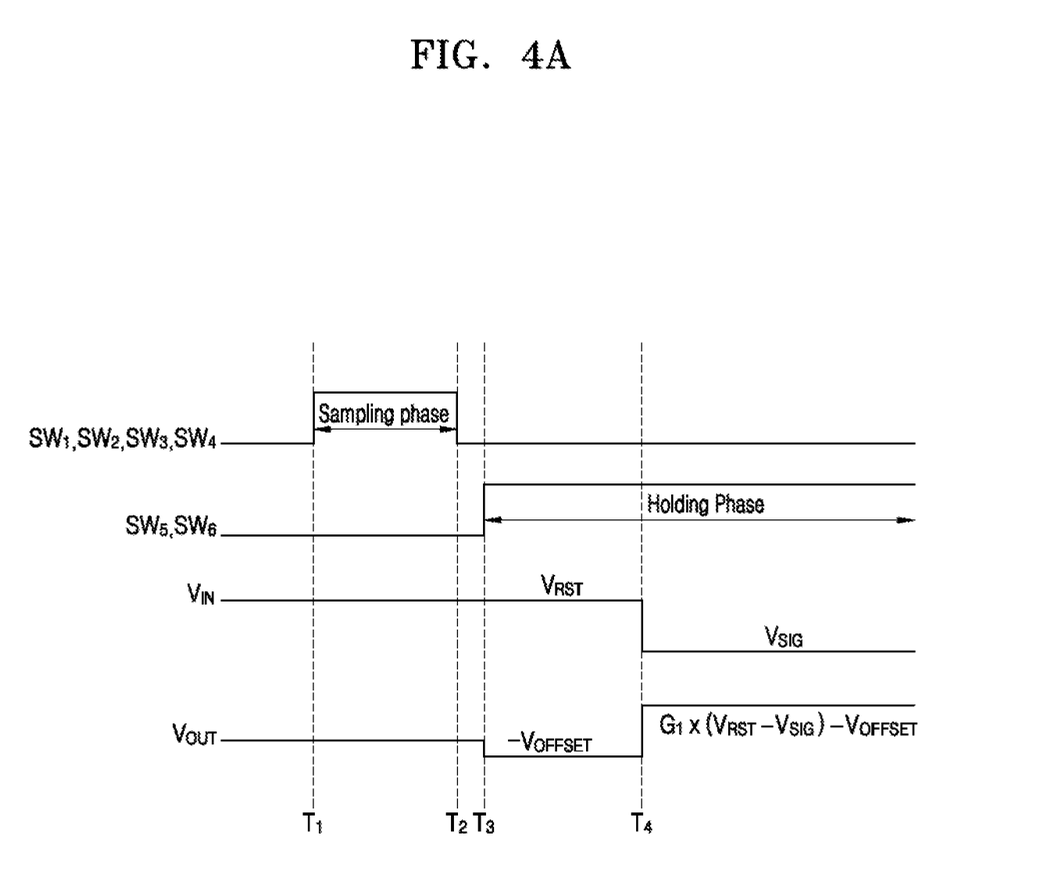
FIG. 4A is a timing diagram showing an operation of an FD CDS circuit according to an embodiment.

According to an exemplary embodiment, the first to fourth switches $SW_1$ to $SW_4$ and the fifth and sixth switches $SW_5$ and $SW_6$ may be alternately activated. That is, while the first to fourth switches $SW_1$ to $SW_4$ maintain an activated state, the fifth and sixth switches $SW_5$ and $SW_6$ may be deactivated. The first to sixth switches $SW_1$, to $SW_6$, as described above, may be alternately activated or deactivated, and thus, double sampling may be performed. This may be described below in greater detail with reference to FIG. 4. According to an exemplary embodiment, each of the first to sixth switches $SW_1$ to $SW_6$ may be implemented as one of an N-channel metal-oxide-semiconductor (NMOS) transistor, a P-channel metal-oxide-semiconductor (PMOS) transistor, and a complementary metal-oxide-semiconductor (CMOS) transistor.

According to an exemplary embodiment, the FD ADC 200 may have greater resolution than the ADC 130 of FIG. 1. For example, the FD ADC 200 may include at least a cyclic ADC, a sigma-delta ADC, and/or a successive approximation register (SAR) ADC.

Figure 3B:
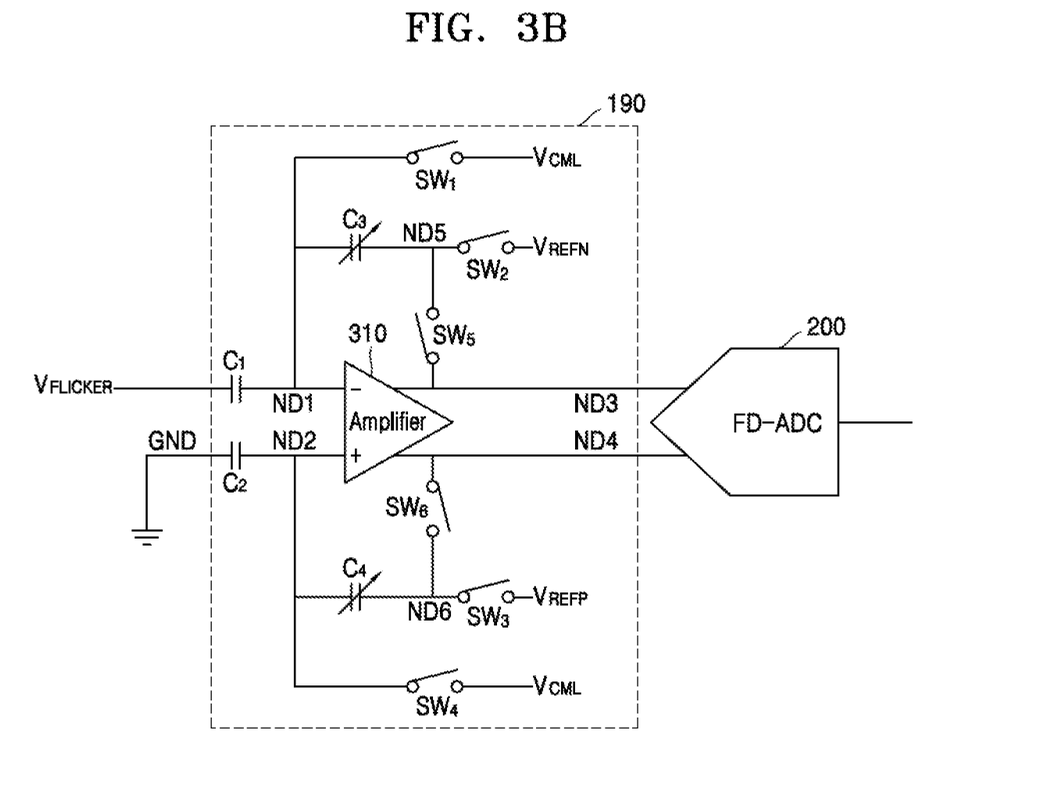
FIG. 3B is a circuit diagram illustrating an FD CDS circuit and an FD ADC according to an embodiment.

Referring to FIG. 3B, a first switch $SW_1$ and a fourth switch $SW_4$ may be respectively referred to as an arbitrary voltage node and a common level voltage node $V_{CML}$. That is, referring to FIG. 3B in conjunction with FIG. 3A, the first switch $SW_1$ and the fourth switch $SW_4$ may each be connected to the common level voltage node $V_{CML}$ instead of an output node of an amplifier 310.

According to an exemplary embodiment, when each of the first switch $SW_1$ and the fourth switch $SW_4$ is connected to the common level voltage node $V_{CML}$, input nodes $ND_1$ and $ND_2$ of the amplifier 310 may be directly connected to the common level voltage node $V_{CML}$.

FIG. 4A illustrates timing for an operation of an FD CDS circuit according to an embodiment.

Referring to FIG. 4A, a T1 to T2 period may be referred to as a sampling period, and a period from T3 may be referred to as a holding period.

In the T1 to T2 period, the first to fourth switches $SW_1$ to $SW_4$ may be activated. Also, in the T1 to T2 period, the fifth and sixth switches $SW_5$ and $SW_6$ may be deactivated. Referring to FIGS. 3A and 3B, in the T1 to T2 period, the FD CDS circuit 190 may receive an input signal $V_{IN}$. The input signal $V_{IN}$ may correspond to an output signal of the flicker pixel array, such as $V_{FLICKER}$ The output signal of the flicker pixel array may be charged into the first capacitor Because the second switch $SW_2$ is activated, the third capacitor $C_3$ may be electrically connected to the negative reference voltage node $V_{REFN}$, and the third capacitor $C_3$ may be charged by a value of the negative reference voltage node $V_{REFN}$. Because the third switch $SW_3$ is activated, the fourth capacitor $C_4$ may be charged based on a value of the positive reference voltage node $V_{REFP}$. Before a time T2, charging of the third capacitor $C_3$ and the fourth capacitor C4 may be respectively completed based on the negative reference voltage node $V_{REFN}$ and the positive reference voltage node $V_{REFP}$.

In a T2 to T3 period, the first to sixth switches $SW_1$ to $SW_6$ may be deactivated. In the T2 to T3 period, the first capacitor $C_1$ may be charged based on the input signal $V_{IN}$, and the third and fourth capacitor $C_3$ and $C_4$ may correspond to a state charged based on a reference voltage value.

In the T3 to T4 period, the first to fourth switches $SW_1$ to $SW_4$ may maintain a deactivations state, and the fifth and sixth switches $SW_5$ and $SW_6$ may be activated. With respect to the input signal $V_{IN}$, an electrical connection including the first capacitor $C_1$, the negative input node $ND_1$ of the amplifier 310, the third capacitor $C_3$, the fifth switch $SW_5$, and the positive output node $ND_3$ of the amplifier 310 may be formed. As described above, amplification may be performed based on a capacitance ratio of the first capacitor $C_1$ and the third capacitor $C_3$, but because a value of the input signal $V_{IN}$ is constant, an output of the FD CDS circuit 190 may have a value obtained by subtracting an output offset value $V_{OFFSET}$ from 0. That is, an output value of the FD CDS circuit 190 may be corrected by the output offset value $V_{OFFSET}$ in the T3 to T4 period. The output offset value $V_{OFFSET}$ may correspond to a difference value between the negative reference voltage node $V_{REFN}$ and the positive reference voltage node $V_{REFP}$.

At a time T4, a magnitude of the input signal $V_{IN}$ may vary. Amplification based on the capacitance ratio may be performed on a variation value of the input signal $V_{IN}$. Therefore, in the holding period, an output value of the FD CDS circuit 190 may be as set forth in Equation 1 that follows.

$$G_1 \times (V_{RST} - V_{SIG}) - V_{OFFSET} \quad \text{[Equation 1]}$$

Here, $G_1$ may denote a gain value, such as an amplification ratio, and may correspond to a ratio of the first capacitor $C_1$ and the third capacitor $C_3$, or to a ratio of the second capacitor $C_2$ and the fourth capacitor $C_4$. $G_1$ may satisfy $C_1/C_3$ (i.e., $G_1=C_1/C_3$), and/or $G_1$ may be the same as $G_2$, which is a ratio of the second capacitor $C_2$ and the fourth capacitor $C_4$. $G_2$ may satisfy $C_2/C_4$ (i.e., $G_2=C_2/C_4$). Also, $V_{RST}$ may correspond to a magnitude of the input signal $V_{IN}$ when there is no light incident upon the image sensor 10, and $V_{SIG}$ may correspond to a magnitude of the input signal $V_{IN}$ when there is light incident upon the image sensor 10.

Figure 4B:
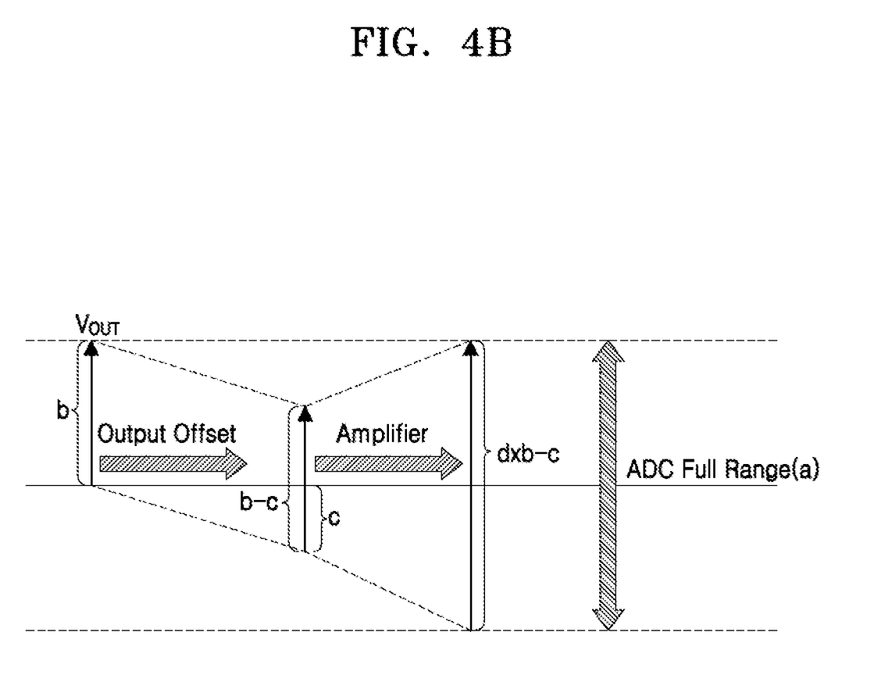
FIG. 4B is a conceptual diagram that illustrates a variation of an output signal of an FD CDS circuit according to an embodiment.

Referring to FIG. 4B, a receivable input range of an ADC receiving an output of the amplifier 310 may correspond to a magnitude a. Considering a characteristic of the image sensor 10 which amplifies a pixel signal to perform signal processing, the pixel signal may have a characteristic of a monotonic increase where the pixel signal continuously increases when light is applied in a state where there is no light. Therefore, in a case where an output of the FD CDS circuit 190 is greater than half of an input range of the FD ADC 200, when an output offset is not adjusted, an output value of the FD CDS circuit 190 may be used as an input of the ADC. On the other hand, according to an exemplary embodiment, when the output offset is applied to an output signal of the FD CDS circuit 190, an output signal of the FD CDS circuit 190 optimized for the input range of the FD ADC 200 may be generated. Referring to FIG. 4B, when an output offset value $V_{OFFSET}$ is not summated and is not amplified by a magnitude of a gain, a magnitude of an output signal of the FD CDS circuit 190 may correspond to b. The output signal of the FD CDS circuit 190 may be amplified by a gain, and a magnitude of the gain may correspond to d. According to an exemplary embodiment, the gain value may correspond to a ratio of a magnitude of an input signal $V_{IN}$ and a magnitude of an input range of the FD ADC 200. For example, when a magnitude b of an input signal $V_{IN}$ is ⅓ of a which is the magnitude of the input range of the FD ADC 200, the gain value may correspond to 3, for example. Because the gain value varies based on a ratio of the magnitude b of the input signal $V_{IN}$ and the magnitude of the input range of the FD ADC 200, the input signal $V_{IN}$ matching a total input range of the FD ADC 200 may be generated.

The FD CDS circuit 190 may summate an output offset so that an amplified output signal matches the input range of the FD ADC 200. Here, a magnitude of the output offset value $V_{OFFSET}$ may correspond to c. That is, the magnitude of the output offset value $V_{OFFSET}$ may not be based on a variation of a gain value and may be independently adjusted. According to an exemplary embodiment, the magnitude of the output offset value $V_{OFFSET}$ may correspond to half of the amplified input signal.

Figure 5A:
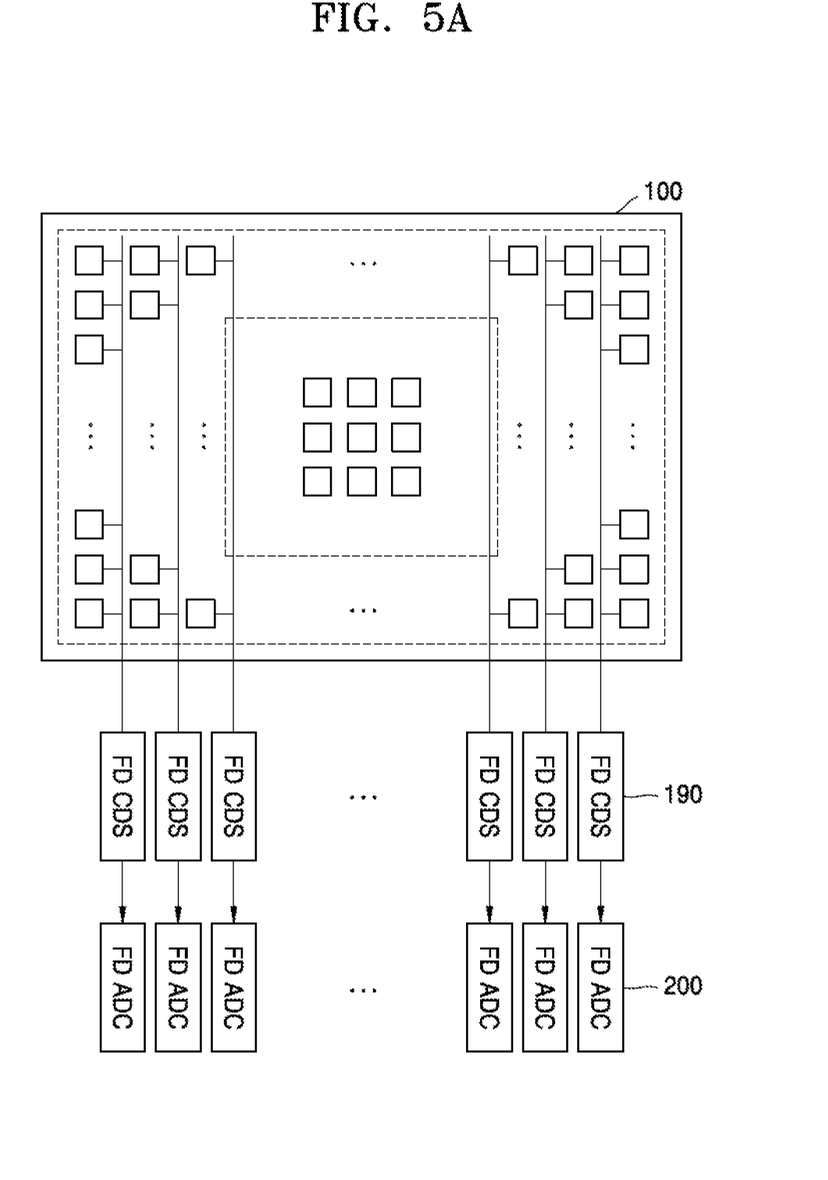
FIG. 5A is a block diagram of a pixel array according to an embodiment.

FIG. 5A illustrates a pixel array 100 according to an embodiment.

Referring to FIG. 5A in conjunction with FIG. 1, the image sensor 10 may include a plurality of FC CDS circuits 190 and a plurality of FD ADCs 200. Referring to FIGS. 1 and 2, a signal is output from the second region 220, such as from the flicker pixel array except the active pixel array, of the pixel array 100, but the inventive concept is not limited thereto.

According to an exemplary embodiment, the image sensor 10 may include the plurality of FC CDS circuits 190 and the plurality of FD ADCs 200, which may each respectively correspond to a column line. Each of the plurality of FC CDS circuits 190 and the plurality of FD ADCs 200 may perform flicker detection in parallel based on a flicker pixel signal $V_{FLICKER}$ received from a flicker pixel of a corresponding column. The image sensor 10 may further include an FFT circuit 210 and a frequency analyzer 220 which are additionally connected to each of the plurality of FC CDS circuits 190 and the plurality of FD ADCs 200.

According to an exemplary embodiment, a flicker detection result may be determined based on flicker detection performed on each of pixels included in the flicker pixel array. For example, as a result of flicker detection performed on 100 flicker pixels, it may be determined that a flicker is detected from 60 pixels, but it may be determined that a flicker is not detected from 40 pixels. Because the number of pixels from which a flicker is detected is more than the number of pixels from which a flicker is not detected, the image sensor 10 may determine that a flicker is detected. As another example, the image sensor 10 may compare a predetermined threshold value with the number of pixels from which a flicker is determined to be detected. When the number of pixels from which a flicker is determined to be detected is more than the threshold value, the image sensor 10 may determine that a flicker is detected, and when the number of pixels from which a flicker is determined to be detected is not more than the threshold value, the image sensor 10 may determine that a flicker is not detected, without limitation.

Figure 5B:
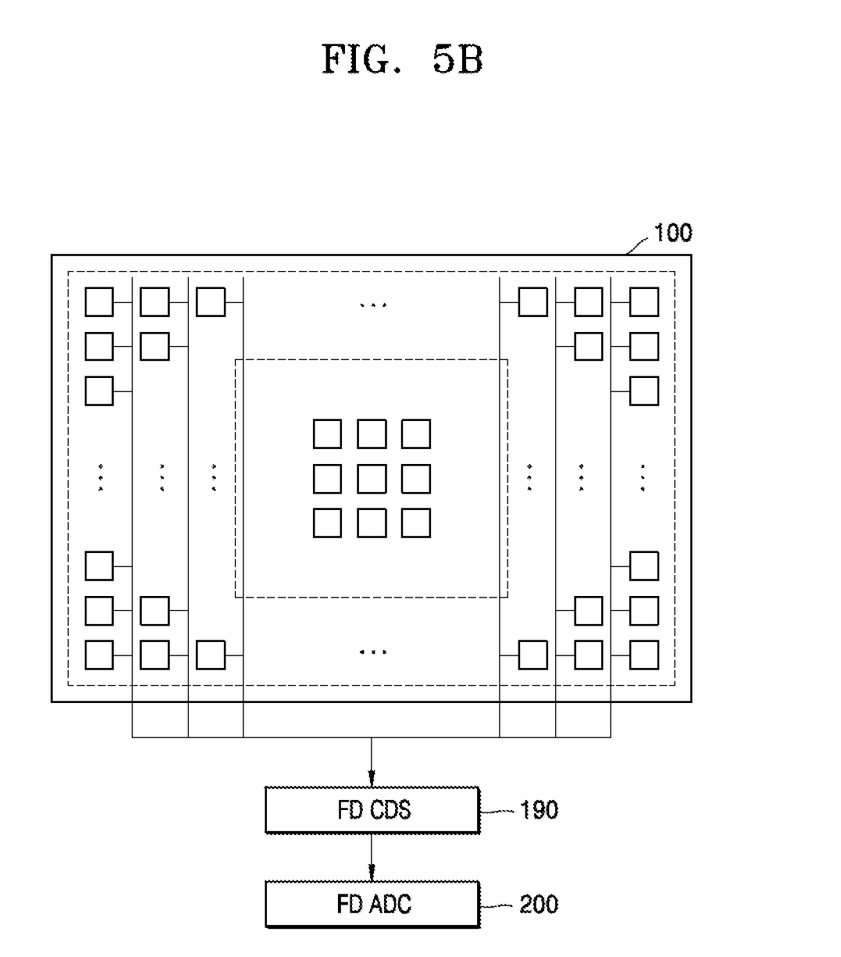
FIG. 5B is a block diagram of a pixel array according to an embodiment.

FIG. 5B illustrates a pixel array according to an embodiment.

Referring to FIG. 5B, one output obtained by merging nodes of all pixels included in the second region 220 may be applied to the FD CDS circuit 190.

According to an exemplary embodiment, a merged output corresponding to a total sum of flicker pixel signals output from the flicker pixels of the second region 220 may be transferred to the FD CDS circuit 190. The FD CDS circuit 190 may amplify the total sum of the flicker pixel signals by a gain, summate output offset values, and transfer a summated output offset value to the FD ADC 200. The FD ADC 200 may convert an analog signal, transferred from the FD CDS circuit 190, into a digital value. In the image sensor 10 where one summated output is transferred to the FD CDS circuit 190, an input range of the FD ADC 200 may be greater than an input range of the FD ADC 200, included in the image sensor 10, receiving a flicker pixel signal through a plurality of column lines of FIG. 5A.

Like that shown in FIG. 1, the FD ADC 200 may transfer a digital value to the FFT circuit 210 and the frequency analyzer 220, thereby allowing the detection or non-detection of a flicker to be determined. That is, the image sensor 10 of FIG. 5B may determine the detection or non-detection of a flicker based on a magnitude of a total sum of flicker pixel signals.

According to an exemplary embodiment, an image sensor may include a pixel array having a first subset of pixels with a first subset of outputs for a first subset of electrical image signals, and a second subset of pixels with at least one second output for at least one electrical flicker signal; a first correlated double sampling (CDS) circuit connected to the first subset of outputs; a first analog-to-digital converter (ADC) connected to the first CDS circuit; and a flicker detection circuit connected to the at least one second output and having a second CDS circuit and a second ADC connected to the second CDS circuit. The image sensor may include a CDS circuit that is responsive to a first subset of reset signals output from the first subset of pixels. The image sensor may include a flicker detection circuit that is responsive to at least one reset signal output from the second subset of pixels.

Figure 6:
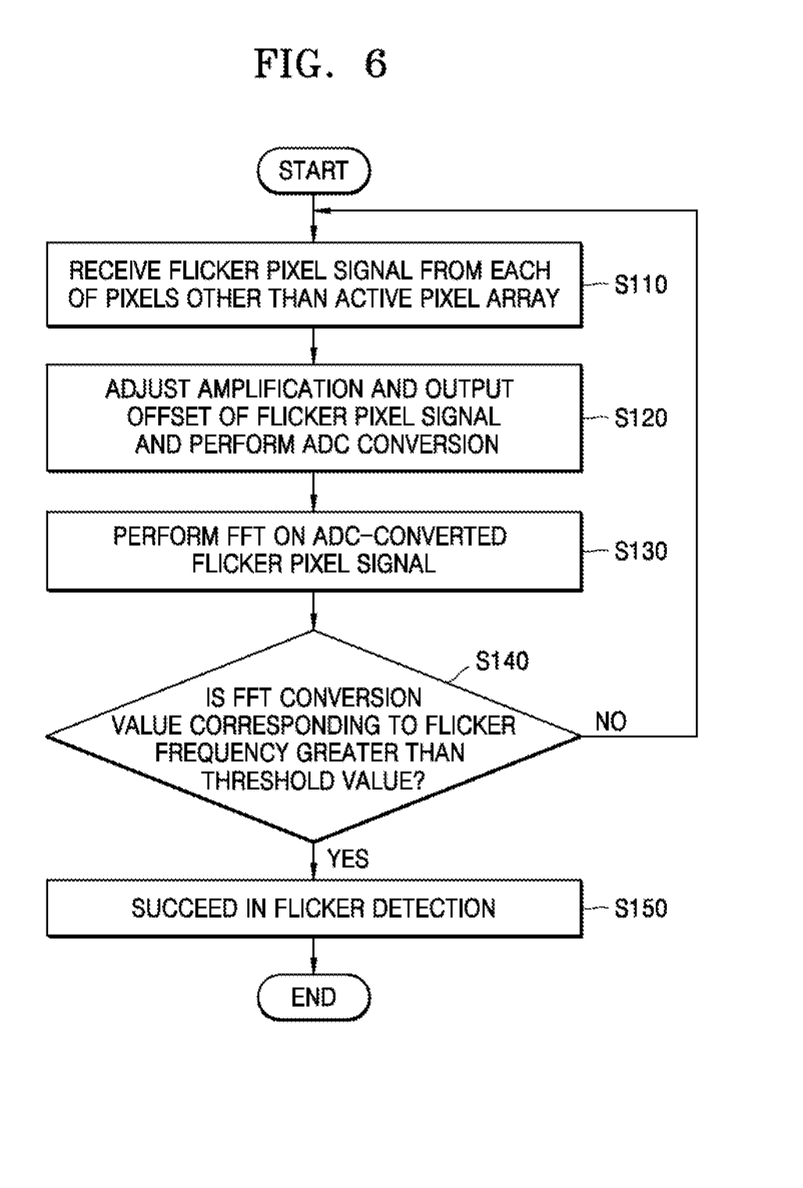
FIG. 6 is a flowchart diagram that illustrates an operation sequence of a flicker detection system according to an embodiment.

FIG. 6 illustrates an operation sequence of a flicker detection system according to an embodiment.

Referring to FIG. 6, in operation S110, the FD CDS circuit 190 may receive a pixel signal from each of pixels other than the active pixel array. The FD CDS circuit 190 may receive a flicker pixel signal from each of pixels of the flicker pixel array of the second region 200 in the pixel array 100. Referring to FIGS. 5A and 5B, the flicker pixel signal may be one signal obtained by merging outputs of the pixels of the flicker pixel array, or may be an output of each of the pixels of the flicker pixel array, but is not limited thereto.

In operation S120, the FD CDS circuit 190 may adjust amplification and an output offset of the flicker pixel signal and may perform ADC conversion. The FD CDS circuit 190 may receive the flicker pixel signal and may amplify the flicker pixel signal based on a gain value. As described above, the gain value may have a value which varies based on a ratio of the first capacitor $C_1$ and the third capacitor $C_3$, for example. The FD CDS circuit 190 may add an output offset value to the amplified flicker pixel signal and may output an added signal to the FD ADC 200. The FD ADC 200 may perform ADC conversion on an output signal to convert an analog signal into a digital signal.

In operation S130, the FFT circuit 220 may perform an FFT on an ADC-converted pixel signal. The received signal may include information about a frequency and amplitude of an output value of the flicker pixel array with respect to time, and thus, the FFT circuit 220 may perform an FFT to convert the received signal into information about the amplitude of the output value of the flicker pixel array with respect to frequency.

In operation S140, the frequency analyzer 220 may determine whether an FFT conversion value corresponding to a flicker frequency is greater than a threshold value. The flicker frequency $F_f$ may correspond to a frequency at which fluorescent light cycles, for example. When an FFT value corresponding to the flicker frequency $F_f$ is greater than a threshold value, the frequency analyzer 220 may determine (operation S140) that a flicker is detected.

Figure 7:
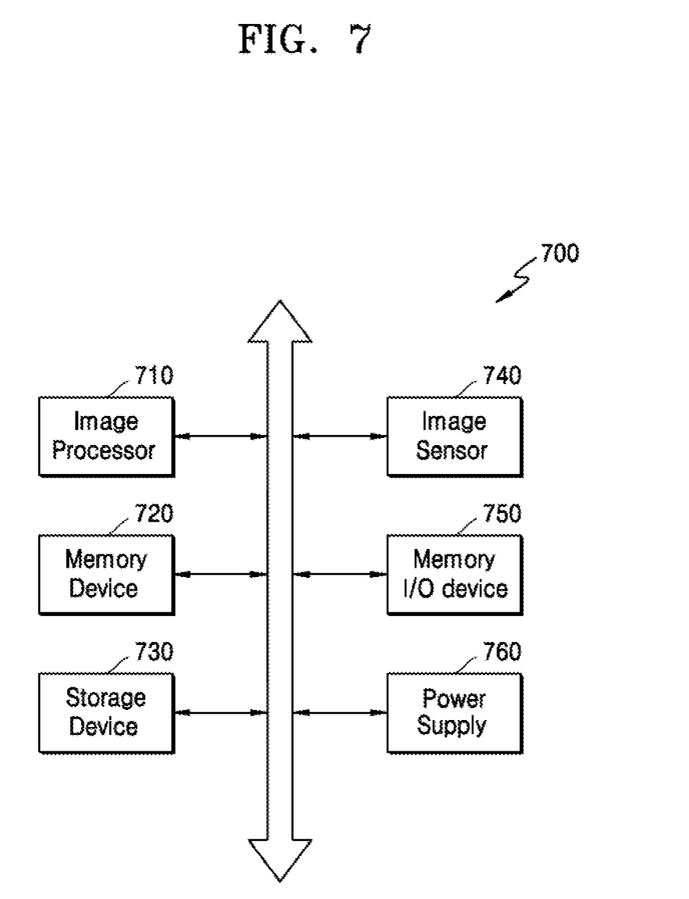
FIG. 7 is a block diagram illustrating a computing system including an image sensor according to an embodiment.

FIG. 7 illustrates a computing system 700 including an image sensor 740 according to an embodiment. The image sensor 740 may be similar to the image sensor 10, so duplicate description may be omitted.

Referring to FIG. 7, the computing system 700 may include an image processor 710, a memory device 720, a storage device 730, the image sensor 740, an input/output (I/O) device 750, and a power supply 760. The image sensor 740 may include a pixel array according to an embodiment, such as but not limited to the pixel array 100 of FIG. 1. The computing system 700 may further include a plurality of ports for communicating with a video card, a sound card, a memory card, a universal serial bus (USB) device, and the like, or for communicating with other electronic devices.

The image processor 710 may perform certain calculations or tasks. For example, the image processor 710 may be a microprocessor or a central processing unit (CPU). The image processor 710 may perform communication with the memory device 720, the storage device 730, and the I/O device 750 through an address bus, a control bus, and a data bus. For example, the image processor 710 may be connected to an extension bus such as a peripheral component interconnect (PCI) bus. When the image processor 710 receives a digital zoom command from a host or the like, the image processor 710 may output zoom information based thereon to the image sensor 740.

The memory device 720 may store data needed for an operation of the computing system 700. For example, the memory device 720 may be configured with dynamic random-access memory (DRAM), mobile DRAM, static random-access memory (SRAM), or a non-volatile memory device. Memory chips may be mounted by using various types of packages. For example, a chip may be packaged as a package such as package on package (PoP), ball grid array (BGA), chip scale packages (CSP), plastic leaded chip carrier (PLCC), plastic dual in-line package (PDIP), die in waffle pack, die in wafer form, chip on board (COB), ceramic dual in-line package (CERDIP), or plastic metric quad flat pack (MQFP).

The storage device 730 may include a solid-state drive (SSD), a hard disk drive (HDD), a CD-ROM, and/or the like. The I/O device 750 may include an input means, such as a keyboard, a keypad, a mouse device, and output units such as a printer and a display. The power supply 760 may supply a working voltage needed for an operation of the computing system 700.

The image sensor 740 may be connected to the image processor 710 through buses or another communication link and may perform communication. The image sensor 740 and the image processor 710 may be integrated into one chip, or may be respectively integrated into different chips. The computing system 700 may be construed as all computing systems using the image sensor 740. For example, the computing system 700 may include a digital camera, a mobile phone, a personal digital assistant (PDA), a portable multimedia player (PMP), a smartphone, a tablet personal computer (PC), etc.

While the inventive concept has been particularly shown and described with reference to exemplary embodiments thereof, it will be understood by those of ordinary skill in the pertinent art that various changes in form and details may be made therein without departing from the spirit and scope of the inventive concept as set forth in following claims.

What is claimed is:

1. A flicker detection circuit comprising:
   a flicker detection correlated double sampling (FD CDS) circuit including first to sixth switches turned on or off based on a control signal, and first to fourth capacitors, the FD CDS circuit being configured to receive a flicker pixel signal output from at least one pixel, summate with an output offset signal, and amplify the summation based on a gain to form a flicker detection signal; and
   an analog-to-digital converter (ADC) configured to quantize the flicker detection signal.

2. The flicker detection circuit of claim 1, wherein the first capacitor and the third capacitor are configured to share a first node corresponding to one input terminal of an amplifier included in the FD CDS circuit,
   the second capacitor and the fourth capacitor are configured to share a second node corresponding to another input terminal of the amplifier, and
   the gain corresponds to a ratio of a capacitance value of the third capacitor and a capacitance value of the first capacitor or a ratio of a capacitance value of the second capacitor and a capacitance value of the fourth capacitor.

3. The flicker detection circuit of claim 2, wherein the first capacitor is connected between a node receiving the flicker pixel signal and the first node,
   the second capacitor is connected between an input voltage node and the second node of the amplifier,
   the input voltage node corresponds to one of a ground node and a node having an arbitrary voltage level,
   the third capacitor is connected between the first node and a fifth node,
   the fourth capacitor is connected between the second node and a sixth node,
   the first switch is connected between the first node and a common level voltage node,
   the second switch is connected between the fifth node and a first reference voltage node,
   the third switch is connected between the sixth node and a second reference voltage node,
   the fourth switch is connected between the second node and the common level voltage node,
   the fifth switch is connected between the fifth node and a third node of the amplifier, and
   the sixth switch is connected between the sixth node and a fourth node of the amplifier.

4. The flicker detection circuit of claim 3, wherein a magnitude of the output offset corresponds to a difference value between the first reference voltage node and the second reference voltage node.

5. The flicker detection circuit of claim 4, wherein, during a sampling period, the first to fourth switches are activated, and the fifth and sixth switches are deactivated,
   the third capacitor is connected to the first reference voltage node based on activation of the second switch and is charged based on a first reference voltage value, and
   the fourth capacitor is connected to the second reference voltage node based on activation of the fourth switch and is charged based on a second reference voltage value.

6. The flicker detection circuit of claim 5, wherein, during a holding period, the first to fourth switches are deactivated, and the fifth and sixth switches are activated, and
   as the fifth switch is activated, an electrical path is formed between the first capacitor and the third capacitor, and accordingly, a variation of the flicker pixel signal is amplified based on a capacitance ratio.

7. The flicker detection circuit of claim 1, wherein each of the first to sixth switches includes one of an N-channel metal-oxide-semiconductor (NMOS) transistor, a P-channel metal-oxide-semiconductor (PMOS) transistor, and a complementary metal-oxide-semiconductor (CMOS) transistor.

8. The flicker detection circuit of claim 2, wherein each of the third capacitor and the fourth capacitor corresponds to a variable capacitor for variably adjusting a value of a capacitance.

9. The flicker detection circuit of claim 1,
   wherein a magnitude of the output offset is variably adjusted based on a magnitude of the amplified flicker pixel signal,
   wherein the ADC comprises at least one of a pipeline ADC, a sigma-delta ADC, and a successive approximation register (SAR) ADC.

10. The flicker detection circuit of claim 1, further comprising:
    a fast Fourier transform (FFT) circuit performing an FFT operation on the flicker detection signal for transforming into a frequency domain; and
    a frequency analyzer,
    wherein the frequency analyzer is configured to identify an FFT value corresponding to a flicker frequency, and determine whether the flicker is detected by comparing the identified FFT value and a threshold value, and
    wherein the flicker frequency corresponds to an operating frequency of a fluorescent lamp.

11. An image sensor comprising:
    a pixel array including a plurality of pixels configured to convert an optical signal into an electrical signal;
    a correlated double sampling (CDS) circuit configured to perform CDS on an image pixel signal and a reset signal output from each of pixels disposed in a first region of the pixel array; and
    a flicker detection circuit configured to perform flicker detection based on a flicker pixel signal and a reset signal output from each of pixels disposed in a second region of the pixel array,
    wherein the flicker detection circuit comprises a sampling circuit including first to sixth switches turned on or off based on a control signal, first to fourth capacitors, and an amplifier amplifying a flicker pixel signal output from the pixel based on a gain and a signal summating the flicker pixel signal and an output offset.

12. The image sensor of claim 11, wherein:
the first region corresponds to a center area of the pixel array,
the second region corresponds to a peripheral area excluding the first region from among the pixel array.

13. The image sensor of claim 11,
wherein the flicker detection circuit further comprises
an analog-to-digital converter (ADC) configured to quantize an analog signal, output from the CDS circuit, into a digital signal.

14. The image sensor of claim 13, wherein:
the first capacitor is connected between a node receiving the flicker pixel signal and the first node,
the second capacitor is connected between an input voltage node and the second node of the amplifier,
the third capacitor is connected between the first node and a fifth node, and shares the first node with the first capacitor,
the fourth capacitor is connected between the second node and a sixth node, and shares the second node with the second capacitor,
the first switch is connected between the first node and a third node corresponding to one output node of the amplifier,
the second switch is connected between the fifth node and a first reference voltage node,
the third switch is connected between the sixth node and a second reference voltage node,
the fourth switch is connected between the second node and fourth node corresponding to another output node of the amplifier,
the fifth switch is connected between the fifth node and a third node of the amplifier, and
the sixth switch is connected between the sixth node and the fourth node of the amplifier.

15. The image sensor of claim 14, wherein:
a magnitude of the output offset corresponds to a difference value between the first reference voltage node and the second reference voltage node, and
wherein the first gain corresponds to a capacitance ratio between the third capacitor and the first capacitor or between the second capacitor and the fourth capacitor.

16. The image sensor of claim 15, wherein:
during a sampling period, the first to fourth switches are activated, and the fifth and sixth switches are deactivated,
the third capacitor is connected to the first reference voltage node based on activation of the second switch and is charged based on a first reference voltage value, and
the fourth capacitor is connected to the second reference voltage node based on activation of the fourth switch and is charged based on a second reference voltage value.

17. The image sensor of claim 16, wherein:
during a holding period, the first to fourth switches are deactivated, and the fifth and sixth switches are activated, and
as the fifth switch is activated, an electrical path is formed between the first capacitor and the third capacitor, and accordingly, a variation of the flicker pixel signal is amplified based on a capacitance ratio.

18. The image sensor of claim 14, wherein:
each of the first to sixth switches includes one of an N-channel metal-oxide-semiconductor (NMOS) transistor, a P-channel metal-oxide-semiconductor (PMOS) transistor, and a complementary metal-oxide-semiconductor (CMOS) transistor, and
each of the first to fourth capacitor corresponds to a variable capacitor for variably adjusting a value of a capacitance.

19. An image sensor comprising:
a pixel array having a first plurality of pixels with a first plurality of outputs for a first plurality of electrical image signals, and a second plurality of pixels with at least one second output for at least one electrical flicker signal;
a first correlated double sampling (CDS) circuit connected to the first plurality of outputs;
a first analog-to-digital converter (ADC) connected to the first CDS circuit; and
a flicker detection circuit connected to the at least one second output and having a second CDS circuit and a second ADC connected to the second CDS circuit,
wherein the flicker detection circuit comprises an amplifier amplifying the at least one second output based on a gain and a signal summating the at least one electrical flicker signal and an output offset.

20. The image sensor of claim 19,
wherein the CDS circuit is responsive to a first plurality of reset signals output from the first plurality of pixels,
wherein the flicker detection circuit is responsive to at least one reset signal output from the second plurality of pixels,
wherein the flicker detection circuit further comprises a sampling circuit including first to sixth switches turned on or off based on a control signal, and first to fourth capacitors.

* * * * *